(12) United States Patent
Fritschle et al.

(10) Patent No.: US 6,288,897 B1
(45) Date of Patent: Sep. 11, 2001

(54) CASING WITH A FAN UNIT AND FAN UNIT

(75) Inventors: Claus Fritschle; Klaus Heesen, both of Stuttgart (DE)

(73) Assignee: Simone Fritschle, Stuttgart (DE)

( * ) Notice: Subject to any disclaimer, the term of this patent is extended or adjusted under 35 U.S.C. 154(b) by 0 days.

(21) Appl. No.: 09/438,175

(22) Filed: Nov. 11, 1999

(30) Foreign Application Priority Data

Mar. 18, 1999 (DE) .......................................... 299 04 928 U

(51) Int. Cl.⁷ .................................. G06F 1/20; H05K 7/20
(52) U.S. Cl. .......................... 361/687; 361/695; 361/683; 165/122; 454/184; 312/236
(58) Field of Search .................................... 361/687, 695, 361/724, 727, 728, 729, 730, 731, 690, 694; 454/184; 165/121–126; 312/236; 415/213.1, 214.1

(56) References Cited

U.S. PATENT DOCUMENTS

| | | | | |
|---|---|---|---|---|
| 4,744,005 | * | 5/1988 | Milani .................................. | 361/687 |
| 4,911,231 | * | 3/1990 | Horne et al. .......................... | 361/695 |
| 5,210,680 | | 5/1993 | Scheibler ............................... | 361/384 |
| 5,572,402 | * | 11/1996 | Jeong .................................... | 361/685 |
| 5,694,294 | * | 12/1997 | Ohashi et al. ........................ | 361/775 |
| 5,788,467 | * | 8/1998 | Zenitani et al. ...................... | 417/360 |
| 5,793,610 | * | 8/1998 | Schmitt et al. ....................... | 361/695 |
| 5,806,949 | * | 9/1998 | Johnson ............................. | 312/334.7 |
| 5,813,243 | * | 9/1998 | Johnson et al. ...................... | 62/259.2 |
| 5,818,689 | * | 10/1998 | Johns et al. .......................... | 361/685 |
| 5,875,101 | * | 2/1999 | Asselta et al. ........................ | 361/775 |
| 5,876,278 | | 3/1999 | Cheng .................................. | 454/184 |
| 5,880,932 | * | 3/1999 | Jelinger ................................ | 361/695 |
| 5,917,698 | * | 6/1999 | Viallet ................................. | 361/695 |
| 6,088,224 | * | 7/2000 | Gallagher et al. .................... | 361/695 |
| 6,094,346 | * | 7/2000 | Schweers et al. .................... | 361/695 |
| 6,104,608 | * | 8/2000 | Casinelli et al. ..................... | 454/184 |
| 6,115,250 | * | 9/2000 | Schmitt ................................ | 361/687 |

FOREIGN PATENT DOCUMENTS 05 243772 12/1993 (JP) .
07 162180 10/1995 (JP) .

* cited by examiner

*Primary Examiner*—Leo P. Picard
*Assistant Examiner*—Lisa Lea-Edmonds
(74) *Attorney, Agent, or Firm*—Quarles & Brady LLP

(57) ABSTRACT

The invention regards a casing for an electronic device, such as a computer or especially a server. The casing has on its top a recess in which a modular fan unit can be inserted. The fan unit is a further element of the invention and serves for cooling the inner components in the casing by producing an air flow through it. For this purpose it comprises several fans. The casing and the fan unit are constructed for easy accessability of the inside of the casing, optimized air flow and handling.

31 Claims, 2 Drawing Sheets

CASING WITH A FAN UNIT AND FAN UNIT

FIELD OF APPLICATION AND PRIOR ART

The invention relates to a casing for an electrical device, particularly an electronic device or a computer, having a fan unit for producing an air flow in at least a part of the casing.

Normally heat builds up in electrical or electronic devices such as computers, as a result of components thereof and must be dissipated in order to avoid overheating. In particular, computer processors must be cooled in order to avoid malfunctions or damage. It is known to fit to a casing of the aforementioned type, generally to its rear wall, a fan unit, which is directed into the casing. As such fan units are generally internally screwed to the casing, replacement is only possible with considerable difficulty.

SUMMARY OF THE INVENTION

The problem of the invention is to provide a casing with a fan unit according to the preamble of claim 1, in which the fitting of the fan unit is improved.

This problem is solved by the features of claim 1. A fan unit insertable from the outside and secured in a casing recess within the casing or device can be easily and rapidly replaced, particularly without it being necessary to open or remove the entire casing. The inserted fan unit can at least substantially and in particular completely project into the casing or device. The fan unit can be located in a recess or a free space within the casing. The distance from further device components contained in the casing can differ as a function of the fan unit used and can in particular be very small.

Preferably the fan unit has at least one electromotive fan and preferably several fans. Several fans can be arranged in a group or at least two fans can be axially juxtaposed. In certain circumstances the fan unit can be detachably secured in the casing in a very simple manner. In the case of insertion from above into the casing, one possibility consists of a mounting support with stop action substantially solely on the basis of the weight of the fan unit. The fan unit is preferably lockable by a nonpositive connection, particularly by locking means. On inserting the fan unit into the casing said locking means can be automatically activated, particularly at the end of the insertion path.

Advantageously there is a locking nose on the casing and a corresponding locking receptacle on the fan unit, particularly in order to simplify a replacement off a defective locking receptacle on the accessible fan unit.

The fan unit is preferably detachable from the casing and is preferably completely detachable or separable. For the electrical supply of the fan unit it is possible to provide a plug connection in the casing and on the fan unit. Advantageously there is a plug coupling, particularly with contacts over which project an envelope, in the casing and a plug on the fan unit. According to ain embodiment the plug connection can be positioned laterally in the casing, preferably on a lateral face. It can in particular be substantially located at the beginning of an insertion path for the fain unit, in order for better centering of the plug connection. Preferably the plug coupling in the casing has some room to move for easier insertion of the plug on the fan unit. A plug connection can form part of the locking means for fixing the fan unit. It is also possible to construct a plug connection as part of guidance means for a positionally correct mounting of the fan unit in the casing.

In the vicinity of the recess the casing can have a guide device for the fan unit on insertion into the casing. The guide can be a system of guide rails and guide receptacles, the guide rails preferably being on the fan unit, e.g. in the form of elongated projections. Advantageously the lateral edge of the fan unit, particularly a fain or its casing, can be part of the guide rails, the casing being provided on the inside with a corresponding, preferably U-shaped guide receptacle.

The fan unit, particularly also the recess, can advantageously extend over a significant part of at least one extension direction of the casing and preferably perpendicular both to the insertion direction and also to the axial direction of the fan or the air flow produced. In this way an air flow can be produced, which moves substantially through the entire casing or its cross-section. The fan unit can in particular extend over a plane perpendicular to the axial direction and takes up a main part of cross-section. It preferably takes up about 80% of the width and about the same of the height. It is possible to install at least one separate channel in the casing running in its longitudinal direction. In one such channel under the fan unit a power unit or several power units can be accommodated. Such a channel can take up less than the entire length of the casing, for example start near the fan unit. The channel in this case can advantageously be made up of a sheet material with special characteristics regarding EMR (electromagnetic resistability) requirements. In this way it is possible to protect the rest of the casing from the electromagnetic radiation of the power unit. The power unit can be provided with its own ventilation, especially an in-built air fan. A preferred place for a power unit is near or on the back side of the casing.

The aeration for the casing and for the power unit can be partly together along the same path. Especially an aeration stream can enter the casing on the front side, then be parted and run on one hand through the fan unit and on the other hand enter the separate channel under the fan unit with the power unit. So the aeration stream is drawn in together by the fan unit and the in-built air fan of the poser unit, wherein it is blown through separately.

On at least one side of the fan unit a further channel can be provided in the casing. This channel preferably is a cable channel with electrical cables running through it. Such cables could be connector cables for disk drives or the like as well as power cables, for example for the fan unit. In such a channel the cables can be securely and orderly mounted and packed, and with such a separate channel there is no risk of injuring a cable. Preferably the cables are multi-cord cables. In one embodiment such multi-cord cables are originally flat connector cables with the single cords being separated after fixing the plug connection to its ends. Such a cable can be easily wound around corners or through small holes.

When the fan unit is inserted the recess in the casing can be at least partly and in particular completely sealed in the insertion area, so that a casing with inserted fan unit appears sealed from the outside.

The casing is advantageously substantially parallelepipedic, particularly flat and elongated in one direction. Along the elongated extension the recess can be located roughly centrally in the casing, advantageously in the area where most of the heal is evolved. Preferably the casing has a front panel and the fan unit air flow runs substantially from said front panel to the opposite back of the casing. In particularly preferred manner, at least on the back and in particular also on the front, there are air openings, preferably also on other lateral faces of the casing, especially in areas with the greatest heat evolution of the device.

According to an embodiment the casing can be a casing module of a computer, particularly a so-called 19" slide-in module for a larger computer, e.g. a medium-s zed to large computer. Such computers can comprise several casing modules of the aforementioned type with different dimensions, particularly with regards to the height. Preferably a casing module of the presently described type has data carrier or disk drives and/or processors, which in particular have a high, lasting cooling air requirement.

The fan unit can be placed e.g. roughly in the middle of the longitudinal direction of the casing. Clearly, the chosen location of the fan unit will depend on the arrangement of the computer units and parts in the casing. Cooling air can be drawn in through the front side, especially through ventilation openings in the form of slits or the like, and run through the casing. Behind the fan the air is being blown through the back part of the casing, leaving the casing through ventilation openings on the lateral sides and on the back side. In the front part of the casing can be mounted components such as disk drives or the like. In the back part processors and electronic circuit boards can be mounted for better ventilation by blowing air at them.

The casing can have a lockable hinged front shutter, after opening of which the front part of the server in the casing is accessible. Furthermore, such a lock could also be used to secure the fan unit in the casing or Lock the whole modular casing against being opened.

The casing or the electrical device in the casing can have several power units, either for more power or for a safe supply. These power units are all connected together to a common busbar, to which the single components like disk drives or the like can be connected. Preferably such a busbar has several plug connections mounted to it, to which can be fitted appropriate plug connections of the components. In this way the change of a component in the casing is very simple, as there need only plug connections to be separated and connected.

It is also possible to create a fan unit for insertion in a casing for an electrical device which, according to the invention, has at least one fan located on a support or the like, with which it can be inserted and retained or locked at least to a very significant extent in a corresponding recess in the casing. On the one hand when the fan unit is inserted from above mounting can particularly easily take place and on the other a locking means can be provided. Advantageously the fan unit is constructed as a slide-in module for the casing. It is in particular mechanically and/or electrically detachable and preferably completely separable from the casing. In particularly preferred manner the fan unit is an independent assembly.

A fan unit can have several fans, which are arranged in a group or juxtaposed. They are preferably axially juxtaposed and in particular are connected directly to one another.

A fan can be detachably fitted to a support, particularly a flat support. Said support can simultaneously form or have a shield for sealing the recess of the casing to the outside.

The fan unit is advantageously detachably mountable in the casing in simple manner and is preferably locked by a nonpositive connection. For this locking means can be provided, particularly in the form of a locking receptacle, which corresponds to a locking nose located in the casing. A fitting of the locking receptacle to the removable fan unit offers the advantage that a defective locking receptacle can be easily replaced.

The at least one fan is preferably an axial flow fan with blades fitted to the rotor, particularly an external rotor of the fan motor. In particularly preferred manner use is made of direct current motors, particularly brushless d.c. motors, e.g. with an operating voltage of 12 V d.c. The operating voltage for the fans can be taken from a power supply unit of the associated casing, e.g. by means of plug contacts closing on inserting the fan unit and located on the latter and the casing.

These and further features can be gathered from the claims, description and drawings and the individual features, either singly or in the form of subcombinations, can be implemented in an embodiment of the invention and in other fields and can represent advantageous, independently protectable constructions for which protection is hereby claimed. The subdivision of the application into individual sections and the subtitles in no way restrict the general validity of the statements made thereunder.

BRIEF DESCRIPTION OF THE DRAWINGS

An embodiment of the invention is explained hereinafter relative to the attached drawings, wherein show.

DETAILED DESCRIPTION OF THE PREFERRED EMBODIMENT

Figure 1:
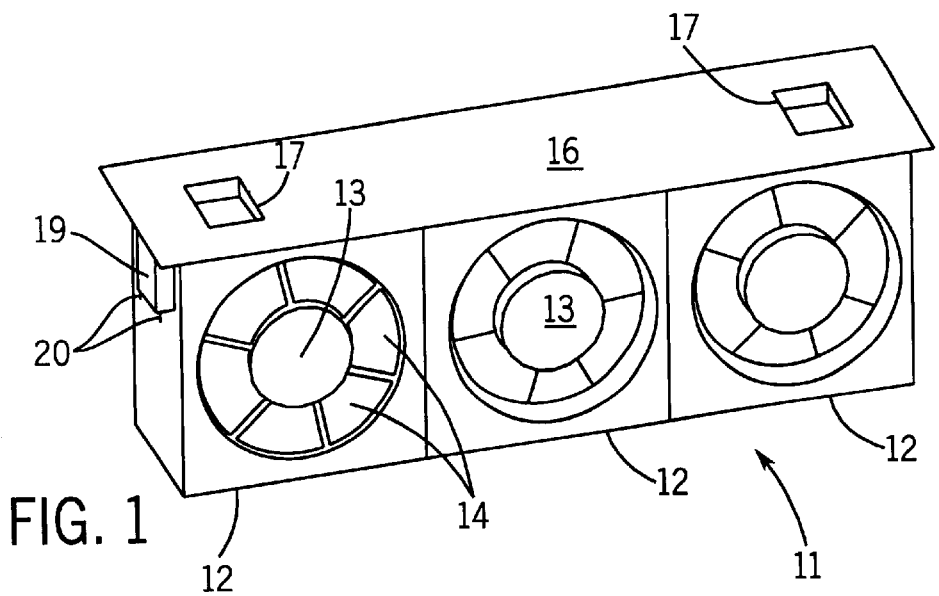
FIG. 1 An inclined view of a fan unit with three juxtaposed axial flow fans.

FIG. 1 shows a fan unit 11 having three juxtaposed fans 12. The fans 12 are constructed as axial flow fans with fan blades 14 fitted to the rotor 13 of a fan motor. With respect to the left-hand fan the blades 14 are solely shown in exemplified manner and are only diagrammatically represented for the two other fans. The three fans 12 form a type of fan field, in which they produce a wide, voluminous and preferably equidirectional air flow.

The fans 12 are connected by means of a not shown carrier or support to the underside of a cover shield 16, which projects over the same both as regards width and depth. To the left and right the shield 16 has two catches 17 by means of which the fan unit 11 is held and can if necessary be drawn out of a casing.

Laterally a connector 19 with two contact pins 20 is fitted to the left-hand fan 12 and the contact pins 20 can be connected to the fans 12 by means of no shown cables. The connector 19 can simultaneously form part of locking means, particularly a locking receptacle. The contact pins 20 can also form part of locking means, preferably locking pins or noses.

Figure 2:
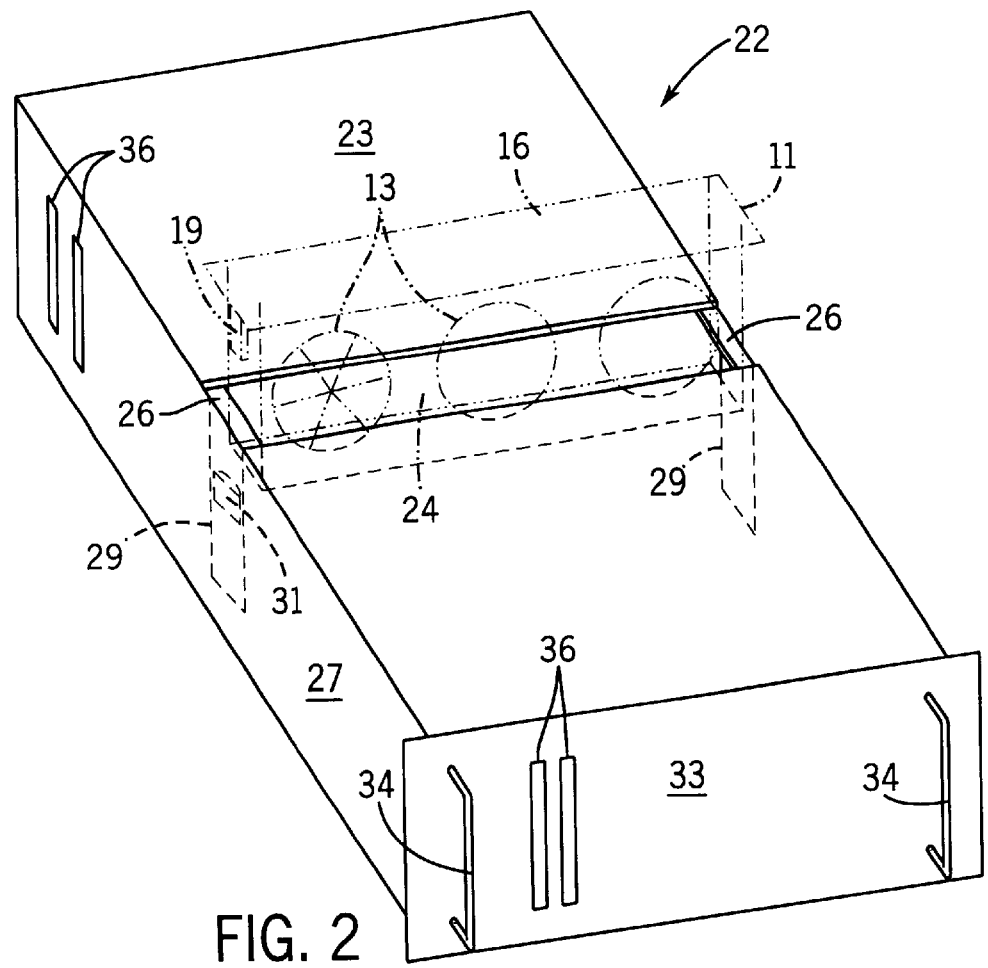
FIG. 2 A casing module with a central recess for a fan unit according to FIG. 1.

FIG. 2 shows a casing 22, which can be constructed in the form of a so-called 19" slide-in module for a computer, particularly a server. Roughly centrally on its top 23 the casing 22 has a recess 24, which extends virtually over the entire width of the casing. It is possible to see on the lateral edges of the recess 24 support profiles 26, which give the casing 22 stability and serve as a supporting means for a fan unit 11 or its cover shield represented in broken line form.

Guide receptacles 29 shown in dotted Sine form extend along the inside of the casing 22, particularly along the inner lateral faces 27 and serve to receive the fan unit 11. In particular, the guidance width thereof corresponds to the extension of the fan unit 11, which is guided in positionally secure manner between the guide receptacles 29. A plug coupling 31 is represented in dotted line form in the upper area of the left-hand guide receptacle 29. On or in said coupling can engage a connector of the fan unit 11 and form the electrical contact between the casing 22 or its power supply unit and the fan unit 11.

The casing 22 has a front panel 33 formed by a plate, which projects somewhat over the sides of the casing. The front panel 33 has both grips 34 for extracting the casing from a casing support and venting slots 36. It is also possible to provide operational units such as switches, displays, keyboards, etc., as well as insertion openings for data carriers or disks. Further venting slots 36 are e.g. provided on the rear, visible lateral face of the casing 22 and advantageously also on the not visible back, particularly substantially distributed over the same. With an air flow along the casing it is advantageous to provide ventilation possibilities at the corresponding casing ends. As a result of the fan unit 11 inserted in the casing 22 and which extends substantially over the entire casing cross-section, it is possible to pass through most and in particular all the devices located in the casing.

A replacement of the fan unit can take place by extraction using the catches 17, particularly also when the fan unit and/or device is in operation. The plug connection is released and following extraction the fan unit is completely separated from the casing 22. A different or a new, functional fan unit can be inserted in the opposite way. For insertion purposes, it is merely necessary to bring the fans 12 into the recess 24 and guide receptacle 29 and then completely slide or engage in the casing.

At the end of the insertion process the plug connection for the electrical contacting of the fans is automatically closed. An operation of the fans 12 can be controlled by the device or automatically started and also monitored. Monitoring permits the detection of a failure of one of the fans and a display or indication thereof.

The catches 17 in FIG. 1 could also be replaced by locks or lockable catches for locking the fan unit 11 in the casing 22. Preferably the cover shield 16 is constructed so as to overlap the front and the back part of the top 23, which can also be separated from the casing. For this it is only possible to remove the top parts 23 with the fan unit taken out. For example, the top parts on the front and the back of the casing 22 can be held under projections of the front end 33 and the back end of the casing. After removal of the fan unit 11 they can be pulled towards each other and be removed.

Figure 3:
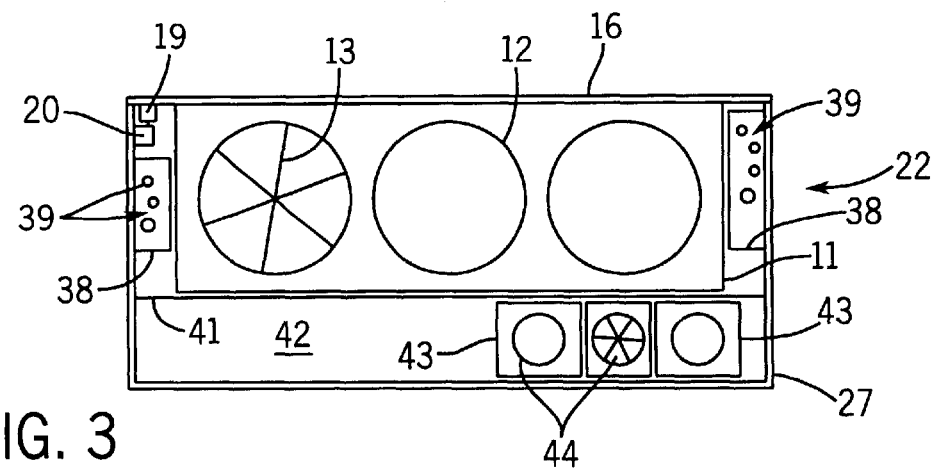
FIG. 3 A schematic view of a longitudinal cross section of the casing with the fan unit inserted and the channels on its sides.

FIG. 3 shows a cross section of the casing 22 in a different embodiment compared to FIGS. 1 and 2. The fan unit 11 has on its sides three channels provided in the casing. On the lateral sides are provided cable channels 38, being made up of sheet metal fixed to the inner sides of the casing 22. They can run at least over the area in which the fan unit 11 is inserted. The cable channels 38 contain several electrical cables 39 These cables 39 mainly are the electrical connections from components in front of the fan unit 11 to components behind the fan unit. The channels 38 can be partly open to insert new cables in it.

Beneath the fan unit 11 is mounted a cover 41 extending over the whole width of the casing 22. This cover 41 is provided for separating a further channel 42 from the rest of the inner of the casing 22. In the channel 42 three power units 43 are provided, which are mounted to the back side of the casing. The cover 41 is for protecting the rest of the casing and its components against the electromagnetic radiation from the power units 42. For this purpose the cover can be made up of advantageous materials like sheet metal combined with radiation screens. The power units 43 do have their own in-built air fans 44 for cooling purposes.

Figure 4:
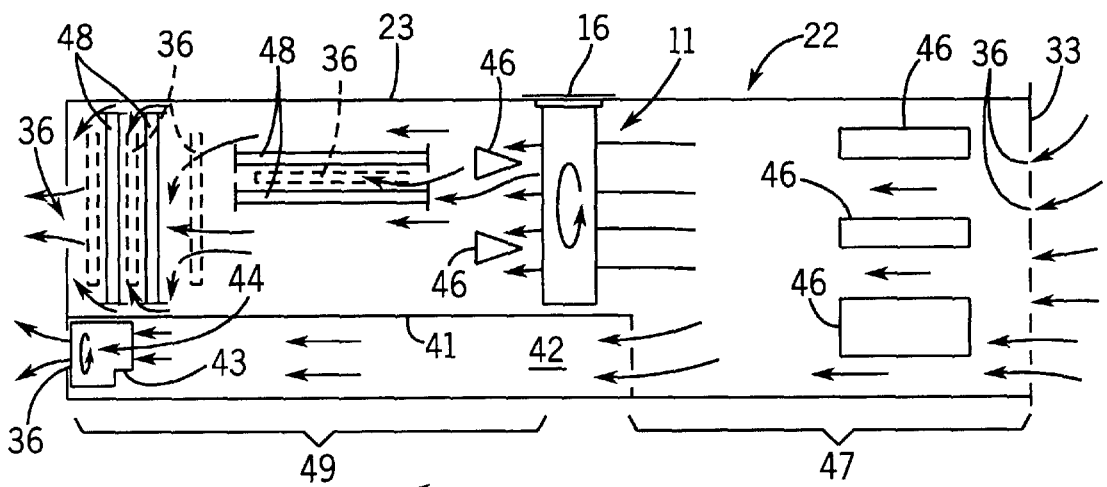
FIG. 4 A schematic view of a lateral cross section of a server casing with the fan unit and the components as well as the cooling air stream.

FIG. 4 mainly shows how the air stream is running through the casing 22. Through ventilating slots 36 in the front 33 air enters the casing being drawn in by the fans 12 of the fan unit 11 as well as by the in-built fans 44 of the power units. In the front: part of the casing are mounted disk drives 46 such as hard disk drives, CD-ROM drives or the like. The air is being drawn through these towards the fans 12 and 44. This is the part 47 of air being drawn.

Before reaching the fan unit 11 the air stream is separated through the channel 42, a part of the air stream entering the channel. In the channel the air is being drawn towards the fans 44 of the power units 43. After streaming along the power units 43 the air is blown out of the casing through ventilating slots 36 on the back side.

The main air stream is running through the upper part of the casing 22, and is blown through the fan unit 11 in the back part. There deflector plates 46 are provided for directing the air flow in a desired direction. Mainly electronic circuit boards 48 are provided in the part 49 of the casing 22 where the air is being blown instead of being drawn. The circuit boards 48 are positioned in such a way that they do not totally block the path of the cooling air. Through ventilating slots 36 air that has been blown through two boards 48 close to each other can be directed outside. In this way a continuous air stream can be maintained even there. Some of the air leaves the casing 22 through slots 36 in the back side.

It can be clearly seen that the air stream running from the right to the left can often be divided and redirected, but the general direction is being maintained. By combining the air streams of the power units 43 with those of the fan unit 11 a stronger air stream and as such a better ventilation can be implemented.

Figure 5:
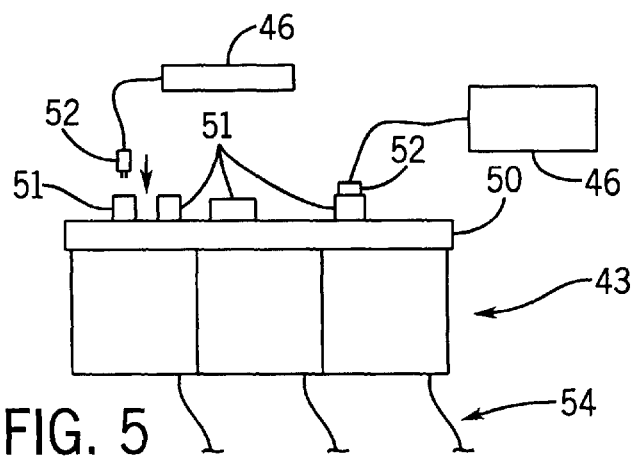
FIG. 5 A schematic view of the power units of the casing with a common busbar, to which are connected components of the server.

FIG. 5 shows schematically how three power units 43 are connected to one single busbar 50, from which the components of an electrical device such as a server draw their electrical power. On the busbar are mounted several plug connectors 51, into which can be fitted appropriate plugs 52 of components such as the disk drives 46. The provision of plugs instead of other possibilities like soldering or Ecrew connections is a much faster and easier connection. Through especially coded plug connections being characteristic for special kinds of components mistakes and wrong connections can be overcome. The power units 43 themselves are connected via connections 54 to a power source such as a mains connection in a server room.

For ecological reasons the casing 22 can be made up mainly of steel which is easily recyclable. No poisonous material is being used.

We claim:
1. A casing assembly for an electronic device, comprising:
 a casing having a top side and a removable top cover disposed on the top side of said casing, said top cover having an opening therein,
 a fan unit for producing an air flow in said casing,
 said fan unit being insertable into said casing through the opening in said top cover and being lockable in said casing,
 where in said fan unit at least partly seals said opening in said top cover, and wherein said top cover is retained on said casing by said fan unit and is only removable from said casing after removal of said fan unit.

2. The casing assembly according to claim 1, wherein said fan unit is inserted and substantially projects into said casing.

3. The casing assembly according to claim 2, wherein said fan unit is located in a recess in an interior of the casing.

4. The casing assembly according to claim 1, wherein said fan unit comprises at least one electromotive fan.

5. The casing assembly according to claim 4, wherein said fan unit comprises at least two fans that are disposed side-by-side.

6. The casing assembly according to claim 1, wherein means are provided for locking said fan unit in said casing, and wherein said fan unit can be detachably retained in said casing and by said means for locking.

7. The casing assembly according to claim 6, wherein means for locking further comprises a locking nose on the casing and a locking receptacle on said fan unit.

8. The casing assembly according to claim 1, wherein said fan unit is detachable and completely separate from said casing, wherein further a plug connection is provided in said casing for the electric power supply of said fan unit, said plug connection comprising a plug coupling in the casing and a plug on the fan unit.

9. The casing assembly according to claim 8, wherein said plug coupling is positioned on one lateral face said casing at the beginning of an insertion path of said fan unit.

10. The casing assembly according to claim 9, wherein said plug coupling in the casing is movable for better insertion of said plug on said fan unit.

11. The casing assembly according to claim 1, wherein said casing in the vicinity of said recess has a guide device for said fan unit for introduction into said casing, wherein said guide device comprises a system of guide rails fixed to said fan unit and guide receptacles fixed to said casing.

12. The casing assembly according to claim 1, wherein at least one single fan of said fan unit forms on the lateral edge of said fan unit said guide rails and on its inside said casing has a corresponding U-shaped guide receptacle.

13. The casing assembly according to claim 1, wherein said fan unit extends over a significant part of at least one extension direction of said casing perpendicular to the insertion direction and to an axial direction of said fan unit.

14. The casing assembly according to claim 13, wherein said fan unit extends over a plane perpendicular to the axial direction and occupies more than half of the cross-section of said casing.

15. The casing assembly according to claim 14, wherein beneath said fan unit in said casing is a separate channel that is separately ventilated, wherein an EMR-protected power unit is placed in said separate channel.

16. The casing assembly according to claim 13, wherein on at least one lateral side of said fan unit in said casing runs a separated channel, in said channel several electrical connector cables are disposed, and wherein said cable channel is without ventilation.

17. The casing assembly according to claim 1, wherein said fan unit completely seals said recess in said casing in the insertion area.

18. The casing assembly according to claim 1, wherein said casing is substantially parallelepipedic, flat and elongated in one direction, said recess in the elongated extension being positioned approximately centrally in said casing.

19. The casing assembly according to claim 1, wherein said fan unit in a ventilation path through said casing is positioned approximately centrally, with air being drawn in through the front end of said casing and blown out through the back end of said casing.

20. The casing assembly according to claim 19, wherein disk drives are positioned in the area of air being drawn in by the said fan unit and processors and electronic circuit boards are positioned in the area of air being blown by said fan unit.

21. The casing assembly according to claim 1, wherein said casing comprises a front panel and the air flow of the fan unit flows substantially from said front panel to the opposite back of said casing, said back being provided with air openings as well as the back parts of the lateral edges of said casing are provided with aeration openings.

22. The casing assembly according to claim 1, wherein an air flow through said casing is being directed by aeration openings as well as deflecting or direction plates.

23. The casing assembly according to claim 1, wherein said casing is a casing module of a 19" slide-in module for a medium sized to large computer, wherein data carriers and disk drives as well as processors are located in said casing module.

24. The casing assembly according to claim 1, wherein said casing comprises a lockable front shutter, wherein with said lockable front shutter of said casing is totally lockable as well as said fan unit.

25. The casing assembly according to claim 1, wherein the power supply of said casing comprises several single power supply stations being connected together with a main busbar, and wherein said busbar plug connectors are mounted for components, including disk drives, in said casing.

26. A fan unit for insert-on in a casing for an electronic device, wherein:
said fan unit comprises at least one fan located on a support,
said fan unit with said support is at least largely insertable and lockable in a corresponding recess within said casing,
said fan unit has projections on said support, and
wherein under said projections other wall parts of said casing can be fitted for being undetachably locked by the inserted fan unit.

27. Fan unit according to claim 26, wherein said fan unit is constructed as a slide-in module and is mechanically and electrically detachable from said casing, being completely separable from said casing forming an independent assembly.

28. The fan unit according to claim 26, wherein said fan unit comprises several fans being juxtaposed and directly linked to one another, further being axially juxtaposed.

29. The fan unit according to claim 26, wherein said fan is detachably fitted to said support, said support being flat for sealing said recess of said casing.

30. The fan unit according to claim 26, wherein said fan unit can be detachably retained in said casing by locking means.

31. The fan unit according to claim 26, wherein said at least one fan is an axial flow fan with fan blades fitted to the rotor of said fan motor.

\* \* \* \* \*